(12) United States Patent
Chiou

(10) Patent No.: US 6,176,993 B1
(45) Date of Patent: Jan. 23, 2001

(54) PROCESS FOR RECYCLING REACTION SYSTEM OF ELECTROPLATING PASSIVATION OF WAFERS

(75) Inventor: Jemy Chien-Wen Chiou, Taipei (TW)

(73) Assignee: General Semiconductor of Taiwan, Ltd., Taipei (TW)

( * ) Notice: Under 35 U.S.C. 154(b), the term of this patent shall be extended for 0 days.

(21) Appl. No.: 09/246,959

(22) Filed: Feb. 9, 1999

(30) Foreign Application Priority Data

Nov. 26, 1998 (TW) .................................................. 87119642

(51) Int. Cl.[7] ...................................................... C25P 21/18
(52) U.S. Cl. .............................. 205/101; 205/99; 205/109
(58) Field of Search .............................. 205/101, 99, 109, 205/316

(56) References Cited

U.S. PATENT DOCUMENTS

| | | | |
|---|---|---|---|
| 5,283,131 | * | 2/1994 | Mori et al. ............................ 428/623 |
| 5,503,733 | * | 4/1996 | Speckmann et al. ................. 205/318 |
| 5,766,440 | * | 6/1998 | Ino et al. ................................ 205/99 |

* cited by examiner

*Primary Examiner*—Kathryn Gorgos
*Assistant Examiner*—Wesley A. Nicolas
(74) *Attorney, Agent, or Firm*—Mayer, Fortkort & Williams, LLC

(57) ABSTRACT

A process for recycling a reaction system of electroplating passivation of wafers, in which lanthanum hydroxide (La $(OH)_3$) or magnesium hydroxide ($Mg(OH)_2$) is added to supplement the lanthanum ion or magnesium ion consumed in an electroplating solution when the pH of the electroplating solution decreases to a range from 0.1 to 0.4.

10 Claims, No Drawings

PROCESS FOR RECYCLING REACTION SYSTEM OF ELECTROPLATING PASSIVATION OF WAFERS

FIELD OF THE INVENTION

The present invention relates to a process for recycling a reaction system of electroplating passivation of wafer. More particularly, the present invention relates to a process for recycling a reaction system of electroplating passivation of wafer for improving the recycling efficiency and increasing the economic advantages thereof.

BACKGROUND OF THE INVENTION

Batch electroplating passivation reaction predominates the current electrical industry, particularly in the manufacture of wafers. To obtain the optimal stabilization of electrical properties and reliability of products, it is typical to manufacture products with stricter property requirement in a small production. For products in a mass production, electroplating solutions should be removed when a specific production is achieved.

For a general process for electroplating passivation of glasses, the electroplating solution used comprises isopropanol, water, lanthanum nitrate, and a glass powder, in which lanthanum ion is used as a carrier of the glass powder so that the glass powder is passivated on the object being deposited. Due to the collection of pollutants and the consumption of additives or uncompensible effect, the quality of the electroplating solution is getting worse and the efficiency of the electrolysis is poor, especially when the electrolysis is conducted in a batch system reactor. The poor efficiency of electrolysis will directly reduce the current reaction induced thereby. Even worse, the electrolysis will not take place.

To solve the problem of poor quality of the electroplating solution, the most common measure is to directly replenish reactants consumed during electrolysis, i.e., to replenish lanthanum nitrate. However, the above measure will result in a collection of $NO_3^-$ as a by-product so that the electrolysis is negatively influenced. Hence, the manufacture of wafers will be negatively influenced. Generally speaking, for an electroplating solution comprising a lanthanum ion of lanthanum nitrate as the carrier of the glass powder, when the concentration of the electroplating solution decreases to 70% of the original concentration, the electroplating solution should be removed to maintain the electroplating property. Thus, the cost of the manufacture will be highly increased. In considering a reasonable cost and a mass production satisfying the demand of market, it is worthwhile to search an economically recyclable electroplating solution.

U.S. Pat. No. 4,233,133 discloses a passivating bath for a semiconductive body and a process for protectively coating a semiconductive body by immersing the same in a bath having particles of a vitreous or ceramic passivating material suspended therein. The bath is formed by suspending passivating particles such as glass thereinto. The bath consists essentially of an organic solvent such as acetone, an amine and a hydrohalogenic acid in proportions yielding a preferable alkaline pH between 4 and 10. This patent uses a batch electroplating passivation reaction for a passivation process and no recycling of electroplating solution is disclosed.

U.S. Pat. No. 3,642,597 is directed to a process for passivating a junction containing semiconductive elements comprising applying an electrically insulative coating to selected surface areas of a junction containing semiconductive wafer, etching the semiconductive wafer through the exposed surface areas to form a depression extending to a depth below at least one junction, removing the portions of the insulative coating undercut in etching, and depositing a junction passivant within the etched depression of the semiconductive wafer. This patent uses a batch electroplating passivation reaction for a passivation process and the used electroplating solution cannot be recycled to extend the time for depositing.

SUMMARY OF THE INVENTION

The object of the present invention is to provide a process for recycling a reaction system of electroplating passivation of wafers.

Another object of the present invention is to provide a process for recycling a reaction system of electroplating passivation of wafers, in which a semibatch (continuous) process is used to conduct a electroplating deposition reaction.

Yet another object of the invention is to provide a process for recycling a reaction system of electroplating passivation of wafers, in which a semibatch (continuous) process is used to conduct a electroplating deposition reaction and lanthanum hydroxide is added (when lanthanum nitrate is used to provide lanthanum ions acting as a carrier) or magnesium hydroxide is added (when lanthanum hydroxide is used to provide a lanthanum ion as a carrier) to supplement lanthanum ions or magnesium ions consumed in the electroplating solution during the electrolysis.

Yet another object of the present invention is to provide a process for recycling a reaction system of electroplating passivation of wafers, in which the yield of the manufacture of wafers is increased by a few times and an economical effect is achieved.

The above features and advantages of the present invention will be better understood with reference to the detailed description and examples. It should also be understood that the process for recycling a reaction system of electroplating passivation of wafers illustrating the present invention is exemplary only and not to be regarded as a limitation of the invention.

DETAILED DESCRIPTION OF THE INVENTION

By way of illustration and to provide a more complete appreciation of the present invention with many of the attendant advantages thereof, the following detailed description is given concerning the process for recycling a reaction system of electroplating passivation of wafers.

The present invention relates to a process for recycling a reaction system of electroplating passivation of wafer, in which lanthanum hydroxide ($La(OH)_3$) is added (when lanthanum nitrate is used to provide lanthanum ions as a carrier) or magnesium hydroxide ($Mg(OH)_2$) is added (when lanthanum hydroxide is used to provide a lanthanum ion as a carrier) to supplement the lanthanum ion or magnesium ion consumed in an electroplating solution when pH of the electroplating solution decreases to a range from 0.1 to 0.4, preferably when pH of the electroplating solution decrease to 0.4.

The additive dissolves in acid and supplements lanthanum ions or magnesium ions consumed in the electroplating solution. The amount of the additive is generally a half to one-fourth of the theoretical amount to avoid the negative influence on the electroplating solution caused by the additive which cannot quickly dissolve in time. After the additive is added, the pH of the electroplating solution is controlled within a range of the original pH and a value below 0.4 from the original pH by an automatic addition system.

The electroplating solution comprises a solvent, water, a carrier material, and a passivant material.

The solvent may be an alcohol, such as isopropanol, n-butanol, isobutanol, or a solvent having similar viscosity, dielectric constant, and molecular structure.

Water is preferably a de-ionized water.

The carrier material may be lanthanum nitrate or magnesium hydroxide. Lanthanum nitrate provides lanthanum ions for the carrier of the passivant material. Magnesium hydroxide provides magnesium ions for the carrier of the passivant material.

The passivant material can be dielectric material, preferably a glass powder.

In the electroplating solution, a chemically inert metal is used as an anode, preferably a platinum anode.

In the electroplating solution, an object which can be deposited, a wafer, is used as a cathode.

The electroplating solution of the present invention will be explained with respect to the components of the electroplating solution, initial effect and addition effect when an additive is added.

The components of the electroplating solution comprise isopropanol, de-ionized water, lanthanum nitrate, and a glass powder.

Total Reaction of the Electroplating Solution $$La(NO_3)_3 \rightarrow La^{3+} + 3NO_3^-$$

$$La^{3+} + \text{glass powder} \rightarrow La^*(glass)^{3+}$$

Lanthanum nitrate dissolves in the electroplating solution as a lanthanum ion and a nitrate ion. The lanthanum ion is then bonded with the glass powder in the electroplating solution and acts as a carrier of the glass powder.

Initial Effect: In the electroplating passivation of glass, the materials that are directly consumed are the glass powder, de-ionized water and the lanthanum ion of lanthanum nitrate, as illustrated in reaction schemes (1) and (2).

Cathode Reaction $$H_2O + 2e^- \rightarrow 2OH^- + H_2 \qquad (1)$$

$$La^*(glass)^{3+} + 3OH^- \rightarrow La(OH)_3^*(glass) \qquad (2)$$

Lanthanum ion ($La^{+3}$) and de-ionized water are critical consumed reactants during the reaction. If lanthanum nitrate is directly added into the electroplating solution, the lanthanum ion is supplemented in time. However, water is still consumed in the reaction. The electrolysis efficiency is not improved and even declined. If de-ionized water is added directly, the added amount will be a factor which cannot be controlled. Furthermore, the direct supplement of lanthanum nitrate will result in a collection of nitrate ions and a risk to corrode the wafer. In addition, the hydrogen ion ($H^+$) produced at the anode will not be neutralized so that the pH of the electroplating solution gradually decreases (scheme 3).

Anode Reaction $$2H^+ + \tfrac{1}{2}O_2 \leftarrow H_2O - 2e^{31} \qquad (3)$$

Effect of the Supplement of Additive: As mentioned above, to supplement a lanthanum ion with the direct addition of lanthanum nitrate will result in residual nitrate ion and the problem that the water is in shortage. To recycle the electroplating solution and magnify the economic scale, lanthanum hydroxide is added into the electroplating solution, as illustrated in reaction scheme (4):

$$La(OH)_3 \rightarrow La^{3+} + 3OH^- \qquad (4)$$

The supplemented lanthanum hydroxide dissolves as a lanthanum ion and hydroxide ion. Hydroxide ion is bonded with hydrogen ions in the electroplating solution to form water. The lanthanum ions and water consumed during the reaction are sufficiently supplemented and the residual nitrate ion and the erosion of wafers derived therefrom are avoided. The consumed lanthanum ion and water can be supplemented with a specific amount. The supplement can be adjusted depending on the pH value to highly increase the recycling rate of electroplating solution and improve the electrical property and reliability of products. The electroplating conditions are mainly directed to the control of pH in the electroplating solution or the control of current density as an auxiliary. Persons skilled in the art are familiar with the setting of electroplating conditions and can choose appropriate ones to practice the present invention.

The process for recycling a reaction system of electroplating passivation of wafers of the present invention will now be further illustrated with reference to the following example.

EXAMPLE

An electroplating solution comprising 1 liter of isopropanol, 0.27 gram of lanthanum nitrate, 25 ml of de-ionized water, and 100 gram glass powder is used. A wafer is used as a cathode. Platinum is used as an anode. The reaction of electroplating passivation of glass on wafer is conducted and the results are shown in Table 1.

TABLE 1

| day | supplement $La(OH)_3$ | the initial pH | numbers of wafers | yield (%) |
|---|---|---|---|---|
| 1 | | 4.39 | 10 | 86.75 |
|   | | 4.33 | 48 | 93.94 |
| 7 | | (4.24*) | | |
| 9 | 0.7 gram | 4.39 | 72 | 92.53 |
| 10 | | 4.38 | 106 | 86.23 |

*the final pH at eighth day

In view of Table 1, the initial pH value is 4.33 at seventh day and the final pH value on the same day is 4.24. It indicates that the concentration of the lanthanum ion in the electroplating solution drops to the extent that supplement should be made. The number of wafers which are passivated with glass is 48. The pH value increases to the initial value on the first day after 0.7 gram of lanthanum hydroxide is added. The number of wafers which are passivated with glass is up to 106 on the tenth day. The effects of recycling of the electroplating solution and saving the cost in exchanging can be achieved by properly supplementing lanthanum hydroxide.

The present invention may, of course, be carried out in other specific ways than those herein set forth without departing from the spirit and essential characteristics of the present invention. The present embodiments are, therefore, to be considered in all respects as an illustration and not restrictive. Therefore, any changes coming within the meaning and equivalency range of the appended claims are to be embraced therein.

I claim:

1. A process for recycling a reaction system of electroplating passivation of wafers, in which lanthanum hydroxide $(La(OH)_3)$ or magnesium hydroxide $(Mg(OH)_2)$ is added to supplement the lanthanum ion or magnesium ion consumed in an electroplating solution when the pH of the electroplating solution decreases from an initial H value to a value within the range from 0.1 to 0.4 less than the initial pH value, so as to recycle the reaction system of electroplating passivation of wafers.

2. A process according to claim 1, wherein the magnesium hydroxide is added when the electroplating solution contains magnesium nitrate.

3. A process according to claim 1, wherein the amount of lanthanum hydroxide or magnesium hydroxide added is a half to one-fourth of a theoretical amount of lanthanum hydroxide or magnesium hydroxide to be added.

4. A process according to claim 1, wherein the electroplating solution comprises an alcohol, water, a carrier material, and a passivant material.

5. A process according to claim 4, wherein the passivant material is a dielectric material.

6. A process according to claim 4, wherein the alcohol is isopropanol, n-butanol, isobutanol.

7. A process according to claim 1, wherein the wafer is used as a cathode and a chemically inert metal is used as an anode.

8. A process according to claim 7, wherein platinum is used as an anode.

9. A process, for recycling a reaction,, system of electroplating passivation of wafers, in which lanthanum hydroxide $(La(OH)_3)$ is added to supplement the lanthanum ion consumed in an electroplating solution when the pH of the electroplating solution decrease from an initial pH value to a value within the range from 0.1 to 0.4 less than the initial pH value.

10. A process for recycling a reaction system of electroplating passivation of wafers, in which lanthanum hydroxide (La(OH)3) or magnesium hydroxide (Mg(OH)2) is added to supplement the lanthanum ion or magnesium ion consumed in an electroplating solution when the pH of the electroplating solution decreases from an initial pH value lo a value within the a from 0.1 to 0.4 less than the initial pH value, wherein the electroplating solution comprises an alcohol, water, a carrier material, and a passivant material, wherein the passivant material is a dielectric material, and wherein the dielectric material is a glass powder.

* * * * *

UNITED STATES PATENT AND TRADEMARK OFFICE
CERTIFICATE OF CORRECTION

PATENT NO. : 6,176,993 B1
DATED : January 23, 2001
INVENTOR(S) : Jemy Chien-Wen Chiou Page 1 of 1

It is certified that error appears in the above-identified patent and that said Letters Patent is hereby corrected as shown below:

Column 2,
Line 22, after "conduct", delete "a" and insert therefor --an--.
Line 51, after "of", delete "wafer" and insert therefor --wafers--.
Line 57, after "when" insert --the--.
Line 59, after "when" insert --the--.
Line 59, after "solution", delete "decrease" and insert therefor --decreases--.

Column 3,
Line 61, delete "$2H^+ + \frac{1}{2}O_2 \leftarrow H_2O - 2e^{31}$" and insert therefor -- $2H^+ + \frac{1}{2}O_2 \leftarrow H_2O - 2e^-$ --.

Column 4,
Line 32, after "on", delete "wafer" and insert therefor -- wafers --.

Column 5,
Line 4, after "initial", delete "H" and insert therefor -- pH --.

Column 6,
Line 3, after "reation", delete ",".
Line 7, after "solution", delete "decrease" and insert therefor -- decreases --.
Line 12, delete "(La(OH)3)" and insert therefor -- $(La(OH)_3)$ --.
Line 12, delete "(Mg(OH)2)" and insert therefor -- $(Mg(OH)_2)$ --.
Line 15, before "a", delete "lo" and insert therefor -- to --.
Line 16, before "from", delete "a" and insert therefor -- range --.

Signed and Sealed this

Twenty-fourth Day of July, 2001

*Attest:*

Nicholas P. Godici

*Attesting Officer*

NICHOLAS P. GODICI
*Acting Director of the United States Patent and Trademark Office*